United States Patent [19]

Long

[11] Patent Number: 5,210,375
[45] Date of Patent: May 11, 1993

[54] ELECTRONIC DEVICE PACKAGE—CARRIER ASSEMBLY READY TO BE MOUNTED ONTO A SUBSTRATE

[75] Inventor: Jon M. Long, Livermore, Calif.

[73] Assignee: VLSI Technology, Inc., San Jose, Calif.

[21] Appl. No.: 723,136

[22] Filed: Jun. 28, 1991

[51] Int. Cl.$^5$ .................. H01L 23/02; H01L 23/28
[52] U.S. Cl. .................. 174/52.4; 174/52.2; 257/787
[58] Field of Search .......... 174/52.2, 52.3, 52.4; 361/392, 393, 394, 395, 399, 400; 357/72, 73, 74

[56] References Cited

U.S. PATENT DOCUMENTS

| | | |
|---|---|---|
| 3,219,748 | 11/1965 | Miller . |
| 3,778,685 | 12/1973 | Kennedy . |
| 4,701,781 | 10/1987 | Sankhagowit . |
| 4,707,725 | 11/1987 | Ito . |
| 4,801,561 | 1/1989 | Sankhagowit . |
| 4,837,184 | 6/1989 | Lin et al. . |
| 4,855,807 | 8/1989 | Yamaji et al. . |
| 4,897,602 | 1/1990 | Lin et al. . |

FOREIGN PATENT DOCUMENTS 6167945 9/1984 Japan .

Primary Examiner—Leo P. Picard
Assistant Examiner—B. Lee Ledynh
Attorney, Agent, or Firm—Majestic, Parsons, Siebert & Hsue

[57] ABSTRACT

The exposed portions of the leads of a semiconductor chip package are first bent in a forming process so that the ends of the leads are in proper positions to be attached to and electrically connected to contacts on a printed circuit board. Intermediate portions of the leads between the distal ends and the package body for connection to the printed circuit board and the package body are enclosed and fixed in position by a carrier body to hold the leads in position and to reduce the effects of any bending in destroying the coplanarity of the distal lead ends of the package. The package with the carrier body may be mounted onto the printed circuit board without first removing the carrier body. After the distal ends of the leads have been soldered to the printed circuit board, the carrier body is then removed.

8 Claims, 4 Drawing Sheets

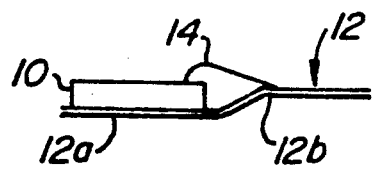
FIG. IA.
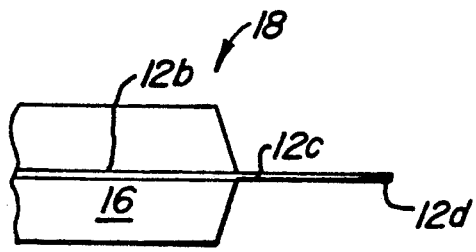
FIG. IB.
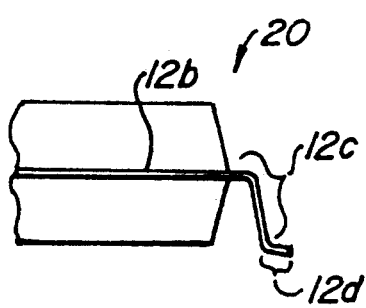
FIG. IC.
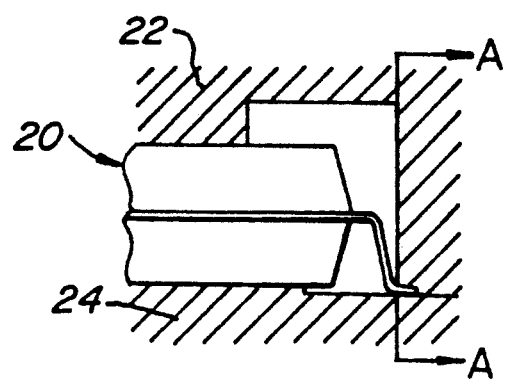
FIG. ID.
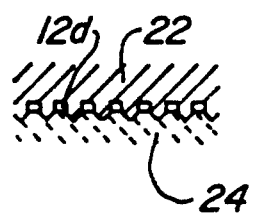
FIG. IE.
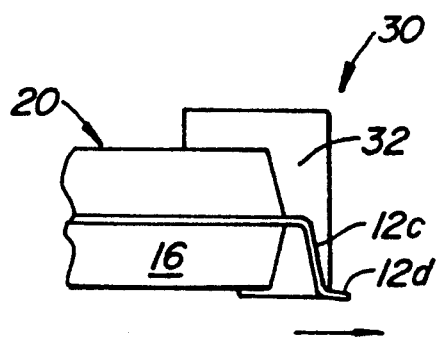
FIG. IF.

ELECTRONIC DEVICE PACKAGE—CARRIER ASSEMBLY READY TO BE MOUNTED ONTO A SUBSTRATE

BACKGROUND OF THE INVENTION

This invention relates in general to electronic device packages and in particular, to a packaged electronic device assembly having a carrier structure where the assembly is ready to be mounted onto a substrate such as a printed circuit (PC) board and attached and electrically connected to contacts on the substrate.

Typically, integrated circuits are housed in structures where the integrated circuit chip and inner portions of leads are surrounded or encapsulated by material forming the package body. The outer ends of the leads protrude from the package body and are attached and electrically connected by conventional methods such as soldering to a PC board, a fixture or socket. With the development of denser and more complex circuitry on integrated circuit chips, there is relentless pressure to reduce the size of the package and/or increasing pin or lead counts. To accomplish such goals, thinner and more fragile leads have frequently been used. With the use of thinner and more fragile leads, lead bending becomes an even more significant problem than before in the semiconductor chip packaging technology.

After the semiconductor die is bonded to a lead frame and encapsulated, the leads are bent into predetermined shapes in a step known as lead forming, so that the end portions of the leads are in proper locations for bonding to a substrate such as a PC board. In the case of surface mount packages, this usually means bending the leads so that the lead end portions are substantially coplanar, so that they are in position to be soldered to contacts on top of the PC board.

Before integrated circuit packages are shipped to customers, they must usually be first tested. Typically, the leads of the packages are first formed into proper shapes ready for connection to PC boards or other substrates before the packages are tested. Testing procedures after the exposed outer ends of the leads outside the package body have been formed sometimes cause the outer ends of the leads to be bent. After testing, the packages are frequently transferred to trays or other containers for shipment to customers. The formed leads are sometimes bent during the transfer process. When the outer ends of the leads are soldered to PC boards or other substrates, this mounting and soldering procedure normally requires the outer ends of the leads to be in proper positions. If lead bending causes the positions of the outer lead ends to deviate from such predetermined positions by greater than a given tolerance, the bent leads must first be corrected or the package must be discarded altogether. For this reason, it is important to avoid bending the leads during the testing or other handling procedures after the leads have been formed but before the packages are shipped to customers.

One solution to the above-described lead bending problem is to encapsulate portions of the outer leads in a carrier frame. One such technique is described by Lin et al. in U.S. Pat. No. 4,897,602. As described in Lin et al., such technique involves employing a copper foil tape with finger contacts that extend further out than that normally required for forming the outer lead ends, where the extended portion forms splayed out portions serving as probe ends for use during testing of the die inside the package. After the semiconductor die and the inner portions of the leads are encapsulated to form the chip package, a carrier frame is molded around and spaced from the periphery of the die or chip package to enclose the extended portions of the leads except for the probe ends. The probe ends are exposed within a slot in the frame or extend from the ends of the frame so that probe tips of testing equipment can be pressed thereon to test the die and its bonds. The stiff molded carrier frame disclosed by Lin et al. acts to support the probe ends of the lead fingers and protects and stiffens the foil tape for the testing operations and for shipping and handling purposes. When the package is ready to be mounted onto the PC board, the carrier frame and probe ends are sheared away and discarded and the remaining portions of the fingers are formed into leads to be interconnected to the PC board. Lin et al. proposed an improved package with carrier frame where a different and relatively lower quality and less expensive material is used for the carrier structure than for the package body to reduce the cost of the package. A package similar to the one described above is also described in U.S. Pat. No. 4,837,184 to Lin et al.

The above-described packages with carrier frames are disadvantageous in that the leads have not been formed when they are shipped to customers. This means that, before customers can mount and connect the package to a substrate such as a printed circuit board, the carrier frame must be sheared off together with the probe ends and the remaining outer lead ends appropriately formed before they can be soldered onto PC boards. Thus customers must perform the lead forming procedure before the packages can be mounted and the package-carrier assembly of Lin et al. is therefore cumbersome for customers to use. Furthermore, lead forming equipment is expensive and can cost up to $100,000 for equipment appropriate for forming leads using thicker lead frames. Because lead forming equipment is expensive, many customers, and in particular smaller companies, may not have the appropriate equipment for forming the leads. It is therefore desirable to provide an improved semiconductor die package with carrier frame where customers do not need to perform the lead forming step. Furthermore, since the carrier frame and the probe ends are sheared off in the above-described devices before the packages can be mounted, the carrier frame and probe ends must be significantly larger than the package itself so that the package-carrier assembly occupies much more space than a package without a carrier frame. This increases the bulk and therefore the cost of shipment to customers. Since a portion of the lead frame is sheared off and discarded, fewer packages will be obtained per unit area of the lead frame, which also increases the cost of the packages. It is therefore desirable to provide a semiconductor package-carrier assembly which is more compact, more efficient in the use of materials and less expensive to ship.

SUMMARY OF THE INVENTION

This invention is based on the observation that the lead forming step required of customers by structures such as Lin et al's described above may be avoided by first forming the leads and then encapsulating most of the outer ends of the leads already formed in a carrier frame, exposing only a small end portion of the lead adequate for attachment and electrical connection to an appropriate substrate. In this manner, when customers receive the package-carrier assembly, the customer may immediately attach and electrically connect (such as by soldering) the exposed end portions of the outer lead ends to contacts on the appropriate substrate. After the small end portions have been so attached and electrically connected, the carrier frame may then be removed if desired. In this scheme, customers need not perform the lead forming step. Furthermore, unlike the design by Lin et al., the carrier frame would not extend to beyond the confines of the lead ends of a conventional chip package so that the package-carrier assembly is no larger than a conventional package without a carrier frame. This reduces the space occupied by the assembly and reduces the cost of shipment.

One aspect of the invention is directed towards a packaged electronic device assembly to be mounted onto a substrate and electrically connected to contacts on the substrate. The assembly comprises an electronic element, a lead structure including a plurality of electrically conductive elongated leads. Each lead has a proximal end near and bonded to the electronic elements, a distal end away from the electronic elements, and an intermediate portion between the proximal and distal ends. The assembly further includes a package body enclosing the electronic elements at proximal ends and a carrier body surrounding at least a portion of the package body. The carrier body encloses the intermediate portions of the leads, leaving the distal ends exposed. The distal ends are in predetermined positions ready to be electrically connected to the contacts without requiring any bending of the leads. In the preferred embodiment, the carrier body completely surrounds and is in contact with the package body.

Another aspect of the invention is directed to lead forming in an electronic device and making a carrier assembly for the device. The device includes an electronic element and leads, where each lead has a proximal end connected to the element and a distal end suitable for connection to a corresponding electrical contact on a substrate and an intermediate portion between the proximal and distal ends. The method comprises bending the leads until their distal ends are in predetermined positions suitable for connection to the contacts, and forming a carrier body enclosing the intermediate portions of the leads to maintain the distal ends in substantially set predetermined positions.

Yet another aspect of the invention is directed to a method for electrically connecting an electronic device with a carrier assembly to a substrate. The device includes an electronic element and leads, where each lead has a proximal end connected to the element and a distal end suitable for connection to a corresponding electrical contact on the substrate and an intermediate portion between the proximal and distal ends. The distal ends are in predetermined positions suitable for connection to the contacts. The assembly includes a carrier body enclosing the intermediate portions of the leads to maintain the distal ends in substantially set predetermined positions. The method includes placing the device with the carrier assembly onto the substrate with the distal end of each lead aligned with and in contact with its corresponding contact. The method further includes bonding the distal end of each lead to its corresponding to physically attach and electrically connect each lead to its corresponding contacts without having to first remove the carrier body. In the preferred embodiment, the method further comprises the step of removing the carrier body after the bonding step.

BRIEF DESCRIPTION OF THE DRAWINGS

FIGS. 1A-1F are schematic cross-sectional views of at least some of the assembled components of a semiconductor package and a carrier ring to illustrate a first embodiment of the invention.

DETAILED DESCRIPTION OF THE PREFERRED EMBODIMENT

Figure 2A:
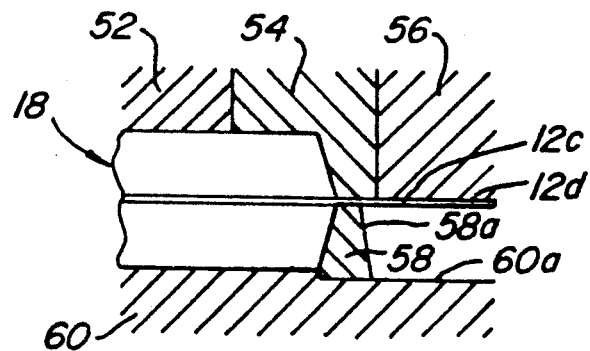
FIGS. 2A-2D are schematic cross-sectional views of a semiconductor package showing at least some of the assembled components of a semiconductor package and a carrier ring a lead form process and the process for forming the carrier ring to illustrate a second embodiment of the invention.

FIG. 1A is a schematic view of a semiconductor die 10 lying on the die attach pad 12a of a lead frame 12. A bonding wire 14 bonds the die 10 to the inner portions of leads in lead frame 12. The configuration of FIG. 1A is known to those skilled in the art. The die 10, die attach pad 12a, bonding wire 14, and the inner portions 12b of the leads of lead frame 12 adjacent to the die are all encapsulated into a package body 16 (made of a material such as plastic) by means of a conventional process such as injection or transfer molding to form a package 18. As shown in FIG. 1B, the proximal ends 12b of the leads are encapsulated within the body 16, exposing intermediate portions 12c and distal portions 12d of the leads outside the body 16. The exposed intermediate and distal portions 12c, 12d are then bent in a conventional trim and form process so that the exposed portions 12c, 12d are shown in FIG. 1C. For many packages, the package 20 shown in FIG. 1C is the final product, which is ready to be tested and then shipped to customers, assuming that the package 20 passes the test.

In accordance with the teachings of this invention, a carrier body is formed surrounding at least a portion of the package body to enclose the intermediate portions 12c of the leads, leaving only the distal ends 12d exposed. The formation of the carrier body is illustrated in FIGS. 1D-1F.

As shown in FIG. 1D, the package 20 is first placed in a mold formed by parts 22, 24. A cross-sectional view of parts 22, 24 with the distal ends 12d of the leads placed in between the parts taken along the line A—A in FIG. 1D is shown in FIG. 1E. As shown in FIGS. 1D, 1E, molding parts 22, 24 leaves a space which surrounds the portion of the package body 16 and the intermediate portions 12c of the leads. This space is filled by a sturdy material such as plastic by a common molding process such as injection or transfer molding and the package-carrier assembly 30 in FIG. 1F is obtained as the finished unit. As shown in FIG. 1F, the package-carrier assembly 30 includes the package 20 and the carrier body 32 which encloses the intermediate portions 12c of the leads and surrounds at least a portion of the package body 16. In the preferred embodiment, the carrier body 32 is also in contact with and completely surrounds the package body 16. Package 20 can still be tested for its electrical properties via the exposed distal ends 12d of the leads. Should package 12 perform satisfactorily in the test, the entire assembly 30 including package 20 and carrier body 32 is shipped to the customer.

FIGS. 2A–2D are schematic views of portions of a semiconductor package and of associated parts for molding a carrier body illustrating a second embodiment of the method for forming the carrier body. The method illustrated in FIGS. 2A–2D begins with the package 18 as shown in FIG. 1B, after the die, bonding wires and the proximal ends of the leads 12b are encapsulated within the package body 16, but before the intermediate portions 12c and distal ends 12d of the leads are formed. To simplify the description, identical components in the figures of this application are identified by the same numerals.

Figure 2B:
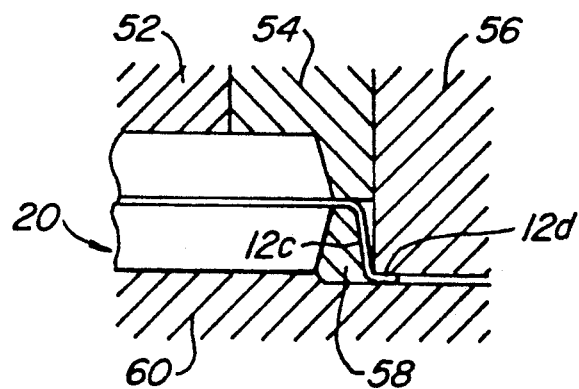

Package 18 is placed in contact with and clamped by form/mold blocks 52, 54, 56, 58 and 60 as shown in FIG. 2A. Block 58 and block 60 have respective adjacent surfaces 58a, 60a that are shaped so that when the intermediate portions 12c are forced against surfaces 58a and the distal end 12d against surface 60a, the intermediate and distal end portions of the leads will conform to the shapes of the surfaces they are in contact with and are of the desired shape for connection to a substrate such as contact pads on a surface mount printed circuit board. Block 56 is thus pushed downward, thereby forcing the intermediate portions 12c against surfaces 58a. When block 56 approaches surface 60a, the distal ends 12d are then forced against surface 60a, in a configuration such as shown in FIG. 2B. After the lead forming step, the package is now essentially the same as package 20 of FIG. 1C so that the package is labeled 20 in FIG. 2B.

Figure 2C:
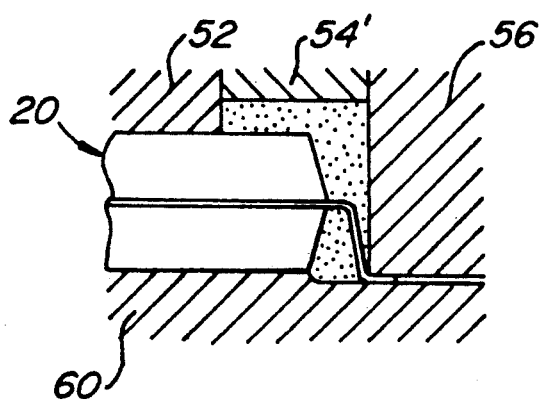
Figure 2D:
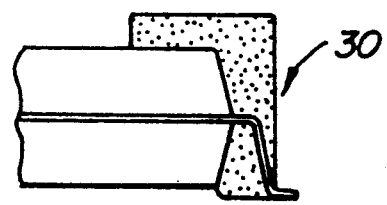

As shown in FIG. 2C, the configuration in FIG. 2B is changed so that block 54 is replaced by a substitute block 54' and block 58 is removed, leaving a space enclosed by package 20 and the blocks 52, 54', 56, 60 in a manner analogous to blocks 22 and 24 of FIG. 1D. Comparing FIGS. 1D, 2C, it will be evident that the method illustrated in FIGS. 2A–2D is advantageous in that package 20 need not be removed from a standard trim and form apparatus to an injection molding apparatus as is done between FIGS. 1C and 1D. Instead, the package 20 remains clamped by the same blocks 52, 60 and 56 in FIGS. 2B, 2C. In order to leave space for the molding process, block 58 is removed and block 54 is replaced by substitute block 54', thereby simplifying the process in lead forming and then molding the carrier molding as compared to the method of FIGS. 1C–1F. The space enclosed by the form/mold port 52, 54', 56, 60 and package 20 is filled by a suitable material such as plastic by a conventional process such as injection or transfer molding. The finished product 30 is the same as that shown in FIG. 1F and is shown in FIG. 2D.

Figure 3A:
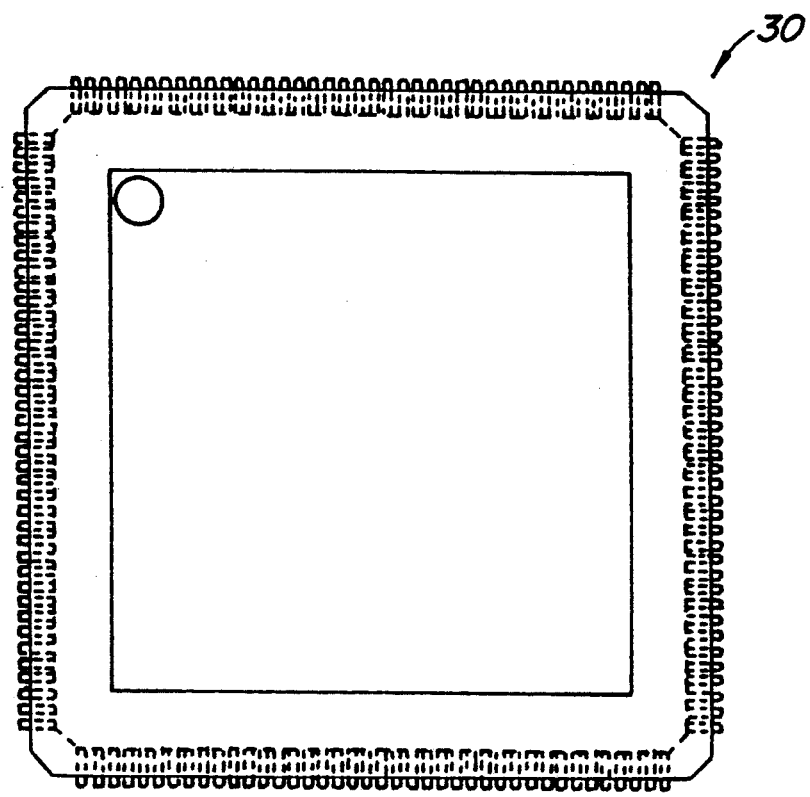
FIG. 3A is a top view of a semiconductor package with carrier assembly formed by the methods illustrated in FIGS. 1A-1F, 2A-2D.
Figure 3B:
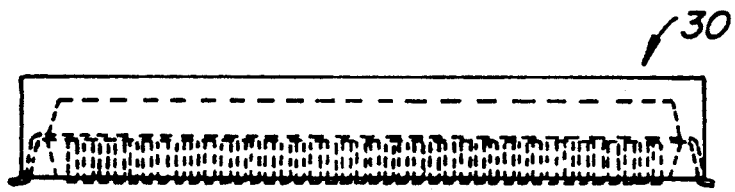
FIG. 3B is a side view of the package and carrier assembly of FIG. 3A.
Figure 3C:
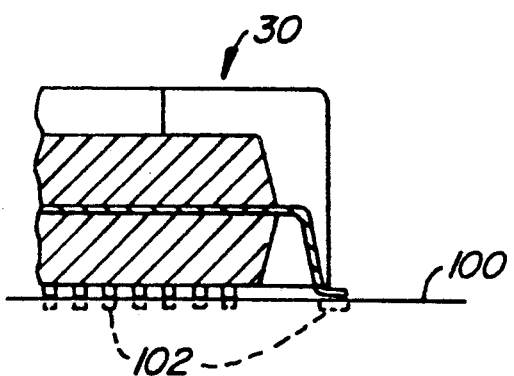
FIG. 3C is a cross-sectional view of a portion of the package and carrier assembly of FIG. 3A and of a substrate, where the leads are aligned and are in contact with the contacts on the substrate to which the leads are to be bonded.

FIG. 3A is a top view of a quad flat pack type package with a carrier body forming a ring surrounding the package body to illustrate the preferred embodiment of the invention. FIG. 3B is a side view of the package-carrier assembly 30 of FIG. 3A, with the package body and the leads enclosed within the carrier body shown in dotted lines. FIG. 3C is a cross-sectional view of a portion of the package 30 in FIG. 3B and of a substrate and contacts thereon. While the invention has been described above by reference to quad flat type packages, it will be understood that it is also applicable to other types of packages, including non-surface mount type packages.

Figure 4:
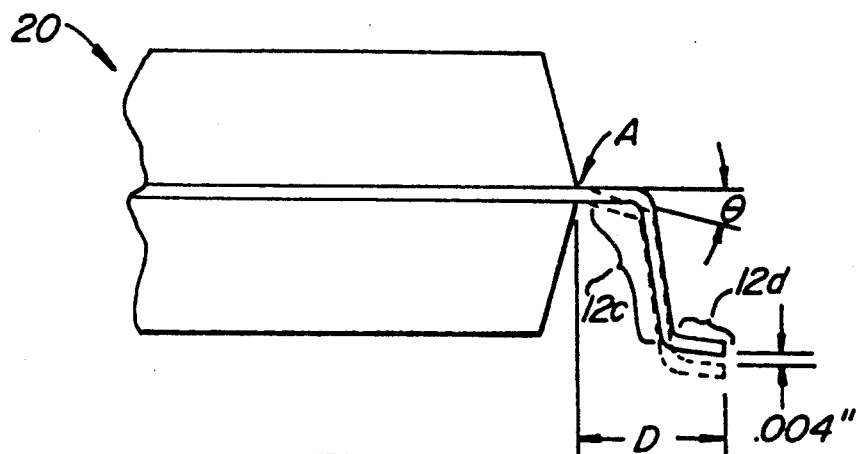
FIG. 4 is a schematic view of a portion of a conventional semiconductor package without a carrier assembly to illustrate the invention.

FIG. 4 is a schematic view of a portion of a conventional package without a carrier assembly to illustrate the invention. As shown in FIG. 4, the intermediate portions 12c of the leads of a lead frame 12 have not been enclosed within a carrier body. When the package undergoes testing or other handling before the package is shipped to customers, the intermediate portions 12c may become bent at point A. For many surface mount type packages, the distal ends 12d of the leads should be coplanar, which means that the distances between the distal ends and a predetermined plane representing the surface to which the package is to be mounted should not be more than a predetermined tolerance value; for many surface type packages, the predetermined tolerance value is about 0.004 inches. The distal ends 12d of the package 20 may extend laterally by a significant distance D shown in FIG. 4, a typical value of which is 1.6 millimeters. Thus if the intermediate portions 12c of the leads are bent by a very small angle $\theta$ greater than the predetermined tolerance value given by $\tan^{-1}$ (0.004 inches/1.6 millimeters), the leads of package 20 are no longer coplanar so that the package must be discarded unless such defect is corrected.

Figure 5:
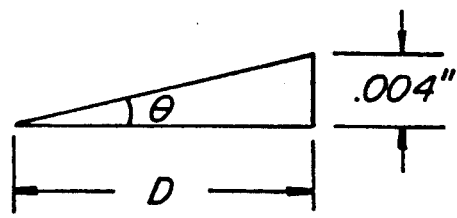
FIG. 5 is a schematic view of a triangle illustrating the bending of leads in the conventional package of FIG. 4.

FIG. 5 is a schematic view showing in geometrical terms the relationship between the distance D, the limit set for "coplanarity" (which in this case is 0.004 inches) and the angle $\theta$.

Figure 6:
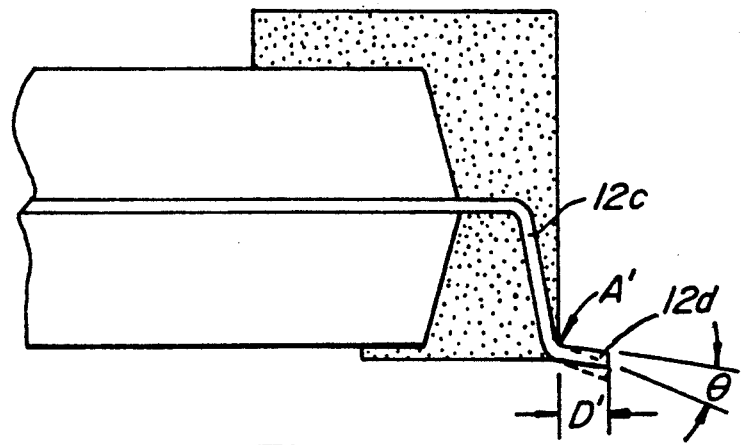
FIG. 6 is a schematic view of a portion of the package and carrier assembly of this invention to illustrate the reduction of the amount of lead bending due to the presence of the carrier ring.

FIG. 6 is a schematic view of a portion of assembly 30 to illustrate the advantages of the invention. Since the carrier body 32 encloses the intermediate portions 12c of the leads, leaving only the distal ends 12d exposed, the point at which the leads can be bent are moved from A in FIG. 4 to point A' in FIG. 6. From point A', the distal ends 12d extend by a much smaller distance D' laterally compared to D, so that even though the leads in FIG. 6 are bent at point A' by the same angle $\theta$ as the intermediate portions bent at point A in FIG. 4, the distal ends will move by a much smaller distance compared to the movement of distal ends 12d in FIG. 4. This is illustrated, for example, by the table below.

| | CONSTANT $\theta$ | | | RETENTION RING COPLANARITY |
|---|---|---|---|---|
| | D | COPLA-NARITY | D' | |
| CURRENT | 1.6 mm | .004 in | .8 mm | .002 in |
| FINE PITCH | 1.3 mm | .004 in | .5 mm | .0015 in |
| FUTURE FINE PITCH | 1.0 mm | .003 in | .5 mm | .002 in |

From the above table, it is seen that, where the leads are bent by a constant angle $\theta$ that causes the distal ends of the leads in a conventional package without the carrier assembly to be bent to the limit of coplanarity of 0.004 inches for current leads, with the help of the retention ring carrier assembly, the distal ends of the leads in the package-carrier assembly 30 are bent only by about 0.002 inches, or half of the deviation as compared to package 20. This assumes that the distal ends 12d extend by about 0.8 millimeters from point A' in FIG. 6. Where the leads used are of fine pitch, the lateral distance D in FIG. 4 becomes 1.3 millimeters whereas the distance D, in FIG. 6 is reduced to 0.5 millimeters, so that the deviation of the ends of portions 12d from the coplanarity plane due to a bending angle $\theta$ is 0.0015 inches compared to 0.004 inches in FIG. 4. For even finer pitch leads that may be achieved in the future, the comparable figures for D, D' are 1.0 and 0.5 millimeters, and the limit of deviation permitted for coplanarity is 0.003 inches and the deviation with the help of the retention ring carrier assembly of end portion 12d is only 0.002 inches.

In addition to the above described advantage, the package-carrier assembly of this invention is also advantageous in that the exposed portions of the leads (as shown in FIG. 6) are much shorter and therefore much stiffer than those in the conventional package (as shown in FIG. 4) and are thus less easily bent. This is important because during testing, the distal ends of the leads are contacted by testing instruments, such as probe tips, and forces are applied by the probe tips to the distal ends. A force applied by the probe tips to the shorter and stiffer exposed lead ends in FIG. 6 would cause such ends to bend by much smaller distances than those by which the longer exposed lead ends in FIG. 4 would be bent by the same force.

As indicated above, assembly 30 is advantageous over the package-carrier assembly disclosed by Lin et al. referenced above. Since the leads have already been formed before the intermediate portion 12c is enclosed within the carrier body, customers need not form the leads before mounting the packages onto printed circuit boards. Instead, the package-carrier assembly 30 may be directly mounted onto a printed circuit board 100 as shown in FIG. 3C. The distal ends 12d may then be attached and electrically connected to contact pads 102 on the substrate 100, such as by soldering. The carrier body 32 may then be removed. The carrier body 32 may be made of paper fiber, in which case it can be removed by dissolving it in water. Alternatively, the carrier body 32 may be made of a plastic material such as polyvinyl acetate and the removing step includes dissolving the plastic material in the carrier body by an organic solvent.

As shown in FIGS. 1A–1F and 2A–2F, the proximal ends 12b of the leads adjacent to and bonded to the die 10 are substantially coplanar in the common plane. For a surface mount package such as illustrated in the figures of this application, the intermediate portions 12c do not lie in the common plane of the proximal ends 12b, but are at angles different from 180° from this common plane. While in the preferred embodiments, the carrier body forms a continuous ring that contacts and completely surrounds the package body in the common plane, it will be understood that the carrier body may form other configurations and need not completely surround or be in contact with the package body. The above-described advantages are retained if the carrier body does enclose the intermediate portions of the leads after such portions have been formed so that the distal ends are in predetermined positions to be electrically connected to contacts on the substrate without requiring any further bending or forming of the leads. While the invention has been illustrated by reference to surface mount type packages, it will be understood that the invention is applicable to other types of packages as well.

While the invention has been described above by reference to one or more embodiments, it will be understood that various modifications may be made without departing from the scope of the invention which is to be limited only by the appended claims.

What is claimed is:

1. A packaged electronic device assembly to be mounted onto a substrate and electrically connected to contacts on the substrate, said assembly comprising:
    an electronic element;
    a lead structure including a plurality of electrically conductive elongated leads, each lead having a proximal end adjacent and bonded to the electronic element, a distal end away from the electronic element and an intermediate portion between the proximal and distal ends;
    a package body enclosing the electronic element and the proximal ends; and
    a carrier body surrounding at least a portion of the package body, said carrier body enclosing the intermediate portions of the leads, leaving the distal ends exposed, said carrier body fixing the positions of the intermediate portions;
    wherein said distal ends are in predetermined positions to be electrically connected to the contacts without requiring any bending of the leads.

2. The assembly of claim 1, wherein the portions of the leads enclosed by the package body are substantially coplanar and in a common plane and wherein the intermediate portions of the leads are not in the common plane.

3. The assembly of claim 2, wherein said intermediate portions of the leads are at angles different from 180 degrees from the common plane.

4. The assembly of claim 1, wherein the portions of the leads enclosed by the package body are substantially coplanar and in a common plane and wherein the carrier body forms a ring that contacts and completely surrounds the package body in the common plane.

5. The assembly of claim wherein the package and carrier bodies enclose most of each of the leads, leaving only the distal ends of the leads exposed for connection to the contacts.

6. The assembly of claim 1, said carrier body being made of paper fiber readily dissolvable by a solvent.

7. The assembly of claim 1, said carrier body being made of a plastic material different from material of the package body and readily dissolvable by a solvent.

8. The assembly of claim 1, wherein the leads have been formed into predetermined shapes suitable for electrical connections with the contacts before said intermediate portions are enclosed and fixed by the carrier body.

* * * * *